US011044836B2

(12) United States Patent
Fujii

(10) Patent No.: US 11,044,836 B2
(45) Date of Patent: Jun. 22, 2021

(54) REFRIGERANT DISTRIBUTION DEVICE, COOLING SYSTEM, AND REFRIGERANT DISTRIBUTION METHOD IN REFRIGERANT DISTRIBUTION

(71) Applicant: NEC Corporation, Tokyo (JP)

(72) Inventor: Shunsuke Fujii, Tokyo (JP)

(73) Assignee: NEC CORPORATION, Tokyo (JP)

( * ) Notice: Subject to any disclaimer, the term of this patent is extended or adjusted under 35 U.S.C. 154(b) by 395 days.

(21) Appl. No.: 15/890,544

(22) Filed: Feb. 7, 2018

(65) Prior Publication Data
US 2018/0279512 A1 Sep. 27, 2018

(30) Foreign Application Priority Data

Mar. 23, 2017 (JP) .............................. JP2017-057352

(51) Int. Cl.
| | | |
|---|---|---|
| H05K 7/20 | (2006.01) | |
| F25B 39/02 | (2006.01) | |
| F25B 49/00 | (2006.01) | |

(52) U.S. Cl.
CPC ..... *H05K 7/20827* (2013.01); *H05K 7/20318* (2013.01); *H05K 7/20327* (2013.01);
(Continued)

(58) Field of Classification Search
CPC ............ H05K 7/20781; H05K 7/20327; F25B 39/028; F25B 49/00; F16K 31/22;
(Continued)

(56) References Cited

U.S. PATENT DOCUMENTS 1,593,664 A * 7/1926 Mitchell ............... F25D 31/003
62/391
1,650,046 A * 11/1927 Rolaff ................... F25B 41/065
62/218
(Continued)

FOREIGN PATENT DOCUMENTS

| CN | 106304752 A | 1/2017 |
|---|---|---|
| JP | S60-134167 A | 7/1985 |

(Continued)

OTHER PUBLICATIONS

Japanese Office Action for JP Application No. 2017-057352 dated Feb. 6, 2018 with English Translation.
(Continued)

*Primary Examiner* — Edward F Landrum
*Assistant Examiner* — Alexis K Cox
(74) *Attorney, Agent, or Firm* — Sughrue Mion, PLLC

(57) ABSTRACT

A refrigerant distribution device includes: a distribution vessel in which a refrigerant liquid flows; a refrigerant inflow pipe connected to a top portion of the distribution vessel and supplied with a refrigerant liquid; a first refrigerant outflow pipe and a second refrigerant outflow pipe connected to a bottom portion of the distribution vessel to discharge the refrigerant liquid; and a float channel switching valve that floats in the refrigerant liquid in the distribution vessel. The flow channel switching valve switches a passage to the first refrigerant outflow pipe when an amount of the refrigerant liquid in one heat receiver does not reach a reference amount of liquid, and cuts off the passage communicating with the first refrigerant outflow pipe and switches the passage to the second refrigerant outflow pipe when the amount of the refrigerant liquid in the one heat receiver reaches the reference amount of liquid.

4 Claims, 4 Drawing Sheets

(52) U.S. Cl.
CPC ........ *H05K 7/20781* (2013.01); *F25B 39/028* (2013.01); *F25B 49/00* (2013.01)

(58) Field of Classification Search
CPC .......... F16K 31/18; F16K 31/20; F16K 31/24; F16K 31/26; F16K 31/30
USPC .......................................................... 62/188
See application file for complete search history.

(56) References Cited

U.S. PATENT DOCUMENTS

| | | | | | |
|---|---|---|---|---|---|
| 1,790,757 | A | * | 2/1931 | Miller | F25B 17/083 |
| | | | | | 62/106 |
| 1,829,387 | A | * | 10/1931 | Arnold | A47F 3/0417 |
| | | | | | 62/220 |
| 2,082,549 | A | * | 6/1937 | Philipp | F25B 5/00 |
| | | | | | 62/198 |
| 2,109,135 | A | * | 2/1938 | Kroft | F28D 7/106 |
| | | | | | 62/219 |
| 2,122,210 | A | * | 6/1938 | Miller | F25B 1/06 |
| | | | | | 62/191 |
| 2,274,391 | A | * | 2/1942 | Zwickl | F25B 41/065 |
| | | | | | 62/117 |
| 2,321,137 | A | * | 6/1943 | Gerard | F24F 1/022 |
| | | | | | 62/271 |
| 2009/0241568 | A1 | * | 10/2009 | Voorhis | F25B 41/22 |
| | | | | | 62/190 |
| 2010/0095688 | A1 | * | 4/2010 | Taras | F25B 39/00 |
| | | | | | 62/115 |
| 2015/0305209 | A1 | * | 10/2015 | Inaba | F28D 15/06 |
| | | | | | 361/679.47 |
| 2016/0282023 | A1 | | 9/2016 | Matsunaga et al. | |
| 2018/0292096 | A1 | * | 10/2018 | Onaka | F24F 1/18 |

FOREIGN PATENT DOCUMENTS

| | | |
|---|---|---|
| JP | S61-175378 A | 8/1986 |
| JP | S62-133073 U | 8/1987 |
| JP | H01-252835 A | 10/1989 |
| JP | H06-195130 A | 7/1994 |
| WO | 2015/087530 A1 | 6/2015 |

OTHER PUBLICATIONS

Singapore Search Report for SG Application No. 10201801130U dated Oct. 2, 2018.

* cited by examiner

REFRIGERANT DISTRIBUTION DEVICE, COOLING SYSTEM, AND REFRIGERANT DISTRIBUTION METHOD IN REFRIGERANT DISTRIBUTION

INCORPORATION BY REFERENCE

This application is based upon and claims the benefit of priority from Japanese patent application No. 2017-057352, filed Mar. 23, 2017, the disclosure of which is incorporated herein in its entirety by reference.

TECHNICAL FIELD

The invention relates to a refrigerant distribution device, a cooling system, and a refrigerant distribution method in a refrigerant distribution device that can efficiently exhaust heat from an electronic device.

BACKGROUND ART

With recent advances in information societies, greater increases in amounts of information are expected. Due to the increasing information, it is necessary to provide a plurality of electronic devices such as servers having high information processing capabilities.

Particularly, in a data center in which a plurality of electronic devices are densely arranged, a large amount of heat is generated and thus a cooling system that exhausts heat using a phase change cycle including evaporation and condensation of a refrigerant is provided for the purpose of maintaining the processing capability thereof.

As such a cooling system, for example, a refrigerant distribution device that distributes and supplies a refrigerant liquid to multi-stage heat receivers and efficiently exhausts heat from the electronic devices using the heat receivers as disclosed in PCT International Publication No. 2015/087530 is used. In the refrigerant distribution device disclosed in PCT International Publication No. 2015/087530, a refrigerant liquid which has been liquefied by a heat radiator flows in a distribution vessel and is supplied to the heat receivers via a pipe disposed in the bottom. When a sufficient amount of refrigerant liquid is supplied to each heat receiver, overflow occurs in the distribution vessel and the overflowing refrigerant liquid flows into a lower distribution vessel that supplies a refrigerant liquid to the next heat receiver via a pipe communicating with a lower liquid phase pipe disposed on a side face thereof. With this structure, a refrigerant is equally supplied to the heat receivers.

SUMMARY

However, in the refrigerant distribution device disclosed in PCT International Publication No. 2015/087530, since an amount of refrigerant liquid supplied from the heat radiator is fixed, an amount of supplied refrigerant liquid may be greater than a decreasing amount of refrigerant liquid that changes in phase in response to reception of heat and is evaporated in the heat receiver. That is, "an amount of refrigerant liquid supplied from the heat radiator" may be greater than "a decrease in an amount of refrigerant liquid due to a phase change in the heat radiator," and thus there is a problem in that the refrigerant liquid does not easily boil due to the weight of the refrigerant liquid in spite of reception of heat in the heat receiver and heat transportation efficiency in cooling in response to a phase change decreases.

In order to solve such a problem, a configuration in which a flow channel switching valve is provided in a refrigerant distribution device as disclosed in Japanese Unexamined Patent Application, First Publication No. S60-134167, Japanese Unexamined Patent Application, First Publication No. S61-175378, or Japanese Unexamined Utility Model Application, First Publication No. S62-133073 has been proposed, but it was not clearly described how operating conditions are set and technical improvement in this regard is expected.

The invention is made in consideration of the above-mentioned circumstances and provides a refrigerant distribution device, a cooling system, and a refrigerant distribution method that can maintain an amount of refrigerant liquid in a heat receiver at a fixed value by clearly setting operating conditions of a flow channel switching valve disposed in a distribution vessel and prevent a decrease in heat reception efficiency in the heat receiver.

In order to solve the above-mentioned problem, the invention proposes the following configurations.

According to a first aspect of the invention, there is provided a refrigerant distribution device including: a distribution vessel in which a refrigerant liquid flows; a refrigerant inflow pipe that is connected to a top portion of the distribution vessel and is supplied with a refrigerant liquid; a first refrigerant outflow pipe that is connected to a bottom portion of the distribution vessel and discharges the refrigerant liquid to one heat receiver; a second refrigerant outflow pipe that is connected to the bottom portion of the distribution vessel and discharges the refrigerant liquid to the other heat receiver; and a float type flow channel switching valve that is disposed in the distribution vessel and operates depending on a level of the refrigerant liquid in the distribution vessel, wherein the flow channel switching valve switches a passage of the refrigerant liquid to the first refrigerant outflow pipe when an amount of the refrigerant liquid in the one heat receiver does not reach a reference amount of liquid, and cuts off the passage communicating with the first refrigerant outflow pipe and switches the passage to the second refrigerant outflow pipe when the amount of the refrigerant liquid in the one heat receiver reaches the reference amount of liquid.

According to a second aspect of the invention, there is provided a cooling system in which a plurality of the refrigerant distribution devices according to the first aspect are disposed to be connected in series in the vertical direction and the first refrigerant outflow pipes of each of the plurality of refrigerant distribution devices are connected to different heat receivers respectively, wherein the refrigerant inflow pipe of the refrigerant distribution device located below is connected to the second refrigerant outflow pipe of the refrigerant distribution device located above.

According to a third aspect of the invention, there is provided a refrigerant distribution method in a refrigerant distribution device including a distribution vessel in which a refrigerant liquid flows, a refrigerant inflow pipe that is connected to a top portion of the distribution vessel and is supplied with a refrigerant liquid, a first refrigerant outflow pipe that is connected to a bottom portion of the distribution vessel and discharges the refrigerant liquid to one heat receiver, a second refrigerant outflow pipe that is connected to the bottom portion of the distribution vessel and discharges the refrigerant liquid to the other heat receiver, and a flow channel switching valve that is disposed in the distribution vessel and switches a passage of the refrigerant liquid to one of the first and second refrigerant outflow pipes, the refrigerant distribution method including: switching the passage by the flow channel switching valve to the first refrigerant outflow pipe when an amount of the refrigerant liquid in the one heat receiver does not reach a reference amount of liquid; and cutting off the passage communicating with the first refrigerant outflow pipe and switching the passage by the flow channel switching valve to the second refrigerant outflow pipe when the amount of the refrigerant liquid in the one heat receiver reaches the reference amount of liquid.

EXAMPLE EMBODIMENT

A configuration of the invention will be described below with reference to FIGS. 1A and 1B.

Figure 1A:
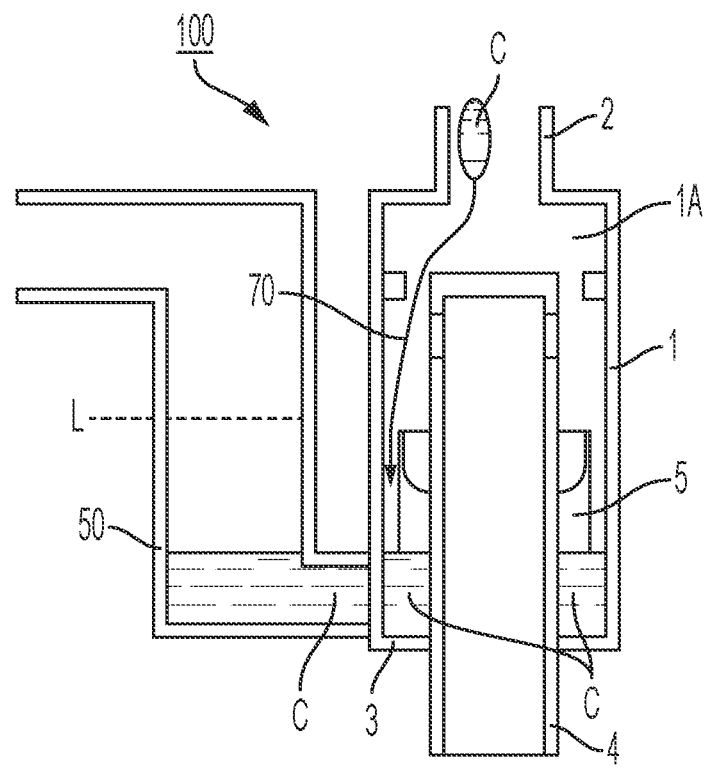
FIGS. 1A and 1B are diagrams schematically illustrating a refrigerant distribution device according to the invention.
Figure 1B:
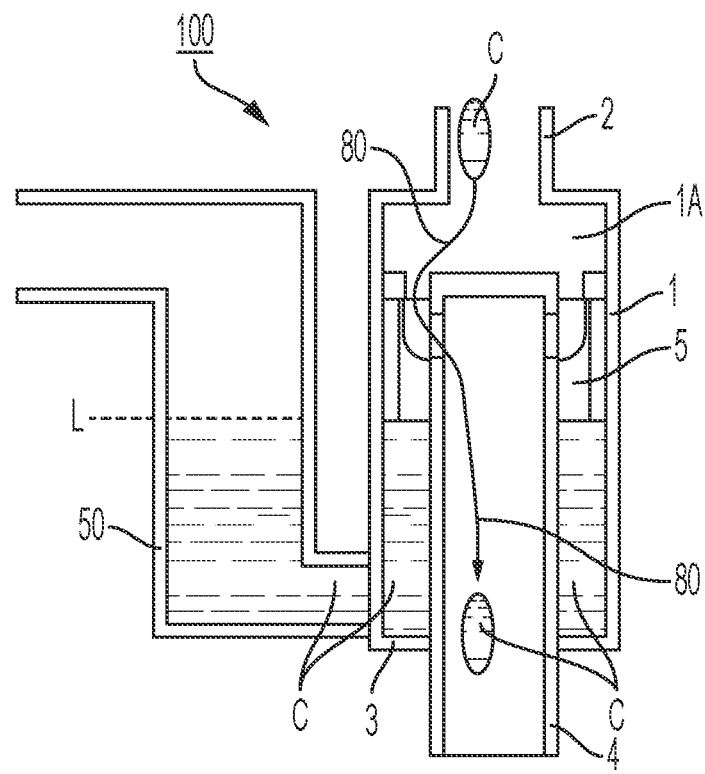

FIGS. 1A and 1B are diagrams schematically illustrating a refrigerant distribution device 100 according to the invention, where reference numeral 1 denotes a distribution vessel serving as a device body.

The distribution vessel 1 has an internal space 1A in which a refrigerant liquid C flows, and a refrigerant inflow pipe 2 that is supplied with a refrigerant liquid C which has been liquefied in a heat radiator (not illustrated) is connected to the top portion thereof.

A first refrigerant outflow pipe 3 that discharges the refrigerant liquid C to one heat receiver 50 and a second refrigerant outflow pipe 4 that discharges the refrigerant liquid C to the other heat receiver (not illustrated) are connected to the bottom portion of the distribution vessel 1.

A float type flow channel switching valve 5 that floats in the refrigerant liquid C is disposed in the internal space 1A of the distribution vessel 1.

As indicated by an arrow 70 in FIG. 1A, the flow channel switching valve 5 switches a passage of the refrigerant liquid C to the first refrigerant outflow pipe 3 when an amount of the refrigerant liquid C in one heat receiver 50 does not reach a reference amount of liquid L. That is, the flow channel switching valve 5 switches the passage to the first refrigerant outflow pipe 3 when a height of the refrigerant liquid C in one heat receiver 50 does not reach a reference height of liquid L.

As indicated by an arrow 80 in FIG. 1B, the flow channel switching valve 5 cuts off the passage communicating with the first refrigerant outflow pipe 3 and switches the passage to the second refrigerant outflow pipe 4 communicating with the other heat receiver (not illustrated) when the amount of the refrigerant liquid C in the one heat receiver 50 reaches the reference amount of liquid L. That is, the flow channel switching valve 5, when the height of the refrigerant liquid C in the one heat receiver 50 reaches the reference height of liquid L, cuts off the passage communicating with the first refrigerant outflow pipe 3 and switches the passage to the second refrigerant outflow pipe 4 communicating with the other heat receiver. With such an operation of the flow channel switching valve 5, it is possible to maintain the refrigerant liquid C in the heat receiver 50 at a fixed value and thus to prevent a decrease in heat reception efficiency in the heat receiver 50.

Since the flow channel switching valve 5 is automatically switched on the basis of an amount of refrigerant liquid C stored in the distribution vessel 1, a particular valve driving device is not required and thus a configuration around the valve is prevented from being complicated.

In the refrigerant distribution device 100 according to the invention, a refrigerant distribution method of "switching the passage by the flow channel switching valve 5 to the first refrigerant outflow pipe 3 when an amount of refrigerant of the refrigerant liquid C in one heat receiver 50 does not reach the reference amount of liquid L and cutting off the passage communicating with the first refrigerant outflow pipe 3 and switching the passage by the flow channel switching valve 5 to the second refrigerant outflow pipe 4 when the amount of refrigerant of the refrigerant liquid C in the one heat receiver 50 reaches the reference amount of liquid L" using the flow channel switching valve 5 is applied.

Embodiment

An embodiment of the invention will be described below with reference to FIGS. 2 to 6.

Figure 2:
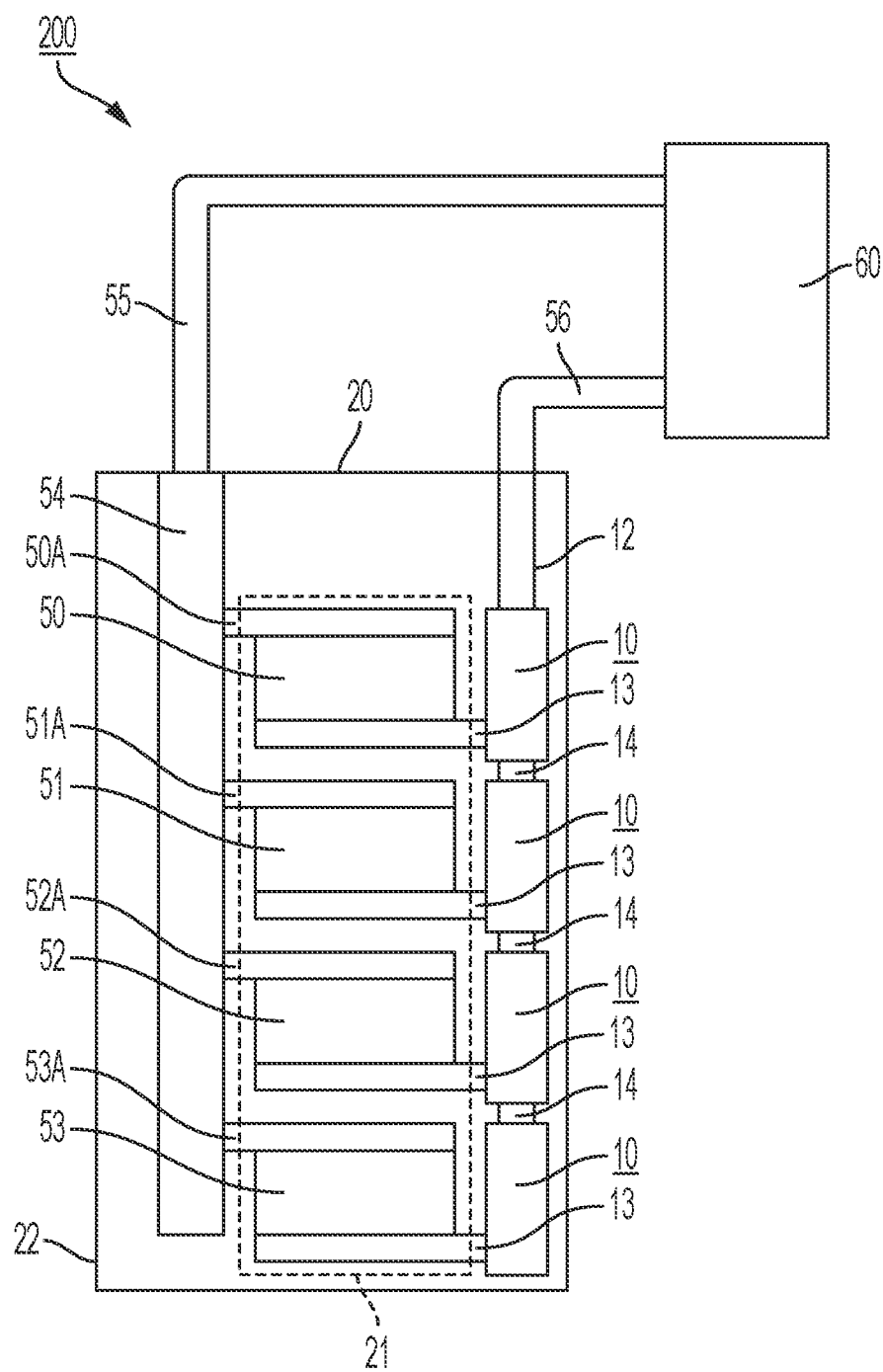
FIG. 2 is a diagram schematically illustrating a configuration of a cooling system according to an embodiment of the invention.

FIG. 2 is a diagram illustrating a cooling system 200 to which the invention is applied as a whole, where a plurality of refrigerant distribution devices 10 according to the invention are connected in series in a vertical direction.

Heat receivers 50 to 53 are connected to the refrigerant distribution devices 10 via first refrigerant outflow pipes 13 (which will be described later), and a refrigerant liquid C therein boils and is evaporated with exhaust heat from electronic devices (not illustrated) in the heat receivers 50 to 53. Accordingly, the electronic devices are cooled.

The refrigerant distribution devices 10 and the heat receivers 50 to 53 are accommodated in a main vessel 20. In the main vessel 20, an opening 21 that causes heat generated in the electronic devices (not illustrated) such as servers to reach the heat receivers 50 to 53 is formed.

A rear door 22 is provided in the main vessel 20. Maintenance of the refrigerant distribution devices 10 and the heat receivers 50 to 53 is performed by opening and closing the rear door 22.

A heat radiator 60 to which the evaporated refrigerant liquid C is guided via vapor pipes 50A to 53A, a merging pipe 54 in the middle thereof, and a connection pipe 55 are connected to the heat receivers 50 to 53.

In the heat radiator 60, heat exchange with external air is performed. As a result, heat of the evaporated refrigerant is removed and thus the refrigerant is liquefied.

Thereafter, the refrigerant liquid C liquefied by the heat radiator 60 is returned to the refrigerant distribution devices 10 via a connection pipe 56 and a refrigerant inflow pipe 12 (which will be described later).

The configuration of one refrigerant distribution device 10 according to this embodiment will be described below with reference to FIGS. 3 to 6.

The refrigerant distribution device 10 located highest among the refrigerant distribution devices 10 which are arranged in series in the vertical direction will be described.

In FIGS. 3 to 6, reference numeral 11 denotes a distribution vessel serving as a device body.

The distribution vessel 11 is a cylindrical body having an internal space 11A in which a refrigerant liquid C flows, and a refrigerant inflow pipe 12 through which the refrigerant liquid C liquefied by the heat radiator 60 is supplied is connected to a top portion 11B thereof.

A first refrigerant outflow pipe 13 and a second refrigerant outflow pipe 14 are connected to the bottom of the distribution vessel 11.

The first refrigerant outflow pipe 13 is disposed in a side wall portion 11C and in a lower part of the distribution vessel 11 and discharges the refrigerant liquid C in the distribution vessel 11 to the heat receiver 50.

The second refrigerant outflow pipe 14 is internally fitted into the distribution vessel 11 to penetrate a bottom portion 11D of the distribution vessel 11, is disposed to form a gap S from the side wall portion 11C of the distribution vessel 11, and discharges the refrigerant liquid C in the distribution vessel 11 to the other heat receivers 51 and 53.

The distribution vessel 11 and the second refrigerant outflow pipe 14 are both disposed coaxially with an axis A in the vertical direction as center.

A float type flow channel switching valve 15 that floats in the refrigerant liquid C is disposed in the internal space 11A of the distribution vessel 11.

The flow channel switching valve 15 includes a partition plate 30 that is disposed to vertically partition the inside of the distribution vessel 11 and a float valve 31 that is disposed below the partition plate 30 and has a buoyant force generated by the refrigerant liquid C.

The partition plate 30 is located in an upper part of the internal space 11A of the distribution vessel 11, is disposed to close the top end of the second refrigerant outflow pipe 14, and is disposed to be horizontal as a whole.

The float valve 31 is formed in a ring shape as a whole and is disposed to be movable in the vertical direction along the axis A outside the second refrigerant outflow pipe 14 internally fitted into the distribution vessel 11. When an amount of refrigerant of the refrigerant liquid C in one heat receiver 50 reaches a reference amount of liquid L, the float valve 31 comes in contact with the partition plate 30 located above and switches a passage communicating with the first refrigerant outflow pipe 13 to the second refrigerant outflow pipe 14.

Switching of the flow channel using the float valve 31 is performed via a flow channel opening 32 formed in the partition plate 30, a flow channel opening 33 formed in the float valve 31, and a flow channel opening 34 formed in the upper part of the pipe wall of the second refrigerant outflow pipe 14.

Figure 3:
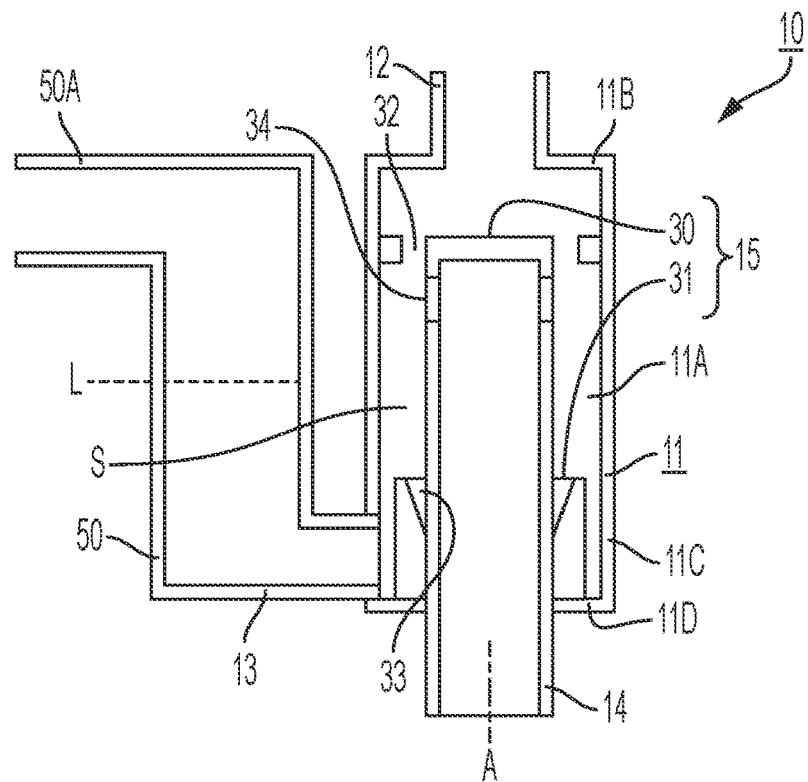
FIG. 3 is a diagram schematically illustrating a configuration of a refrigerant distribution device included in the cooling system illustrated in FIG. 2.
Figure 4:
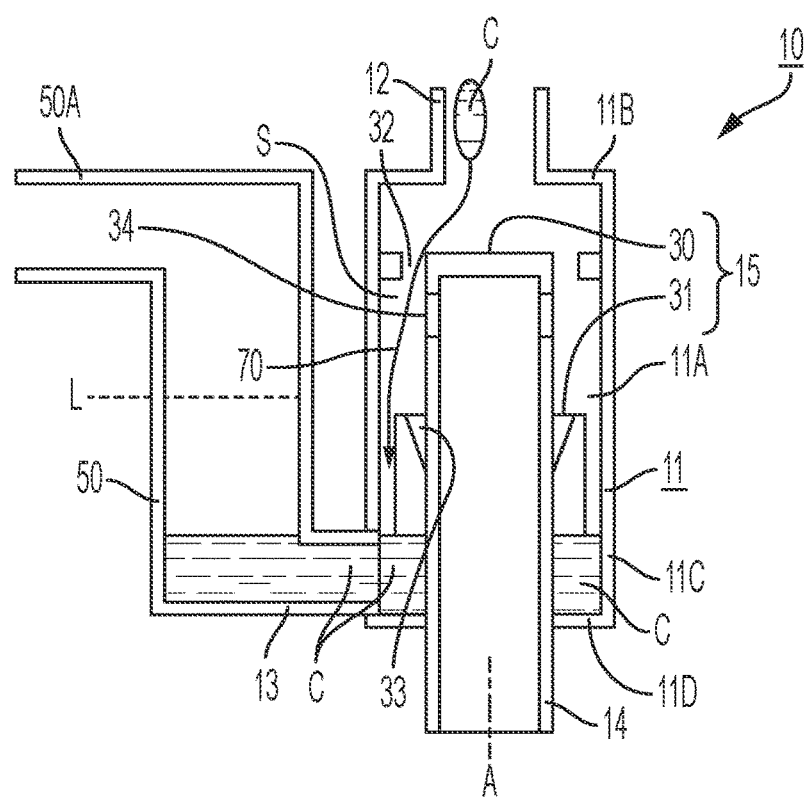
FIG. 4 is a diagram illustrating details of an operation of the refrigerant distribution device which is subsequent to FIG. 3.

Specifically, as illustrated in FIGS. 3 and 4, when the amount of refrigerant of the refrigerant liquid C in the heat receiver 50 does not reach the reference amount of liquid L, the float valve 31 is located at a lower position not to come in contact with the partition plate 30. Accordingly, the flow channel opening 32 formed in the partition plate 30 communicates with the gap S between the distribution vessel 11 and the second refrigerant outflow pipe 14, and supply of the refrigerant liquid C to the heat receiver 50 via the first refrigerant outflow pipe 13 is continuously performed.

Figure 5:
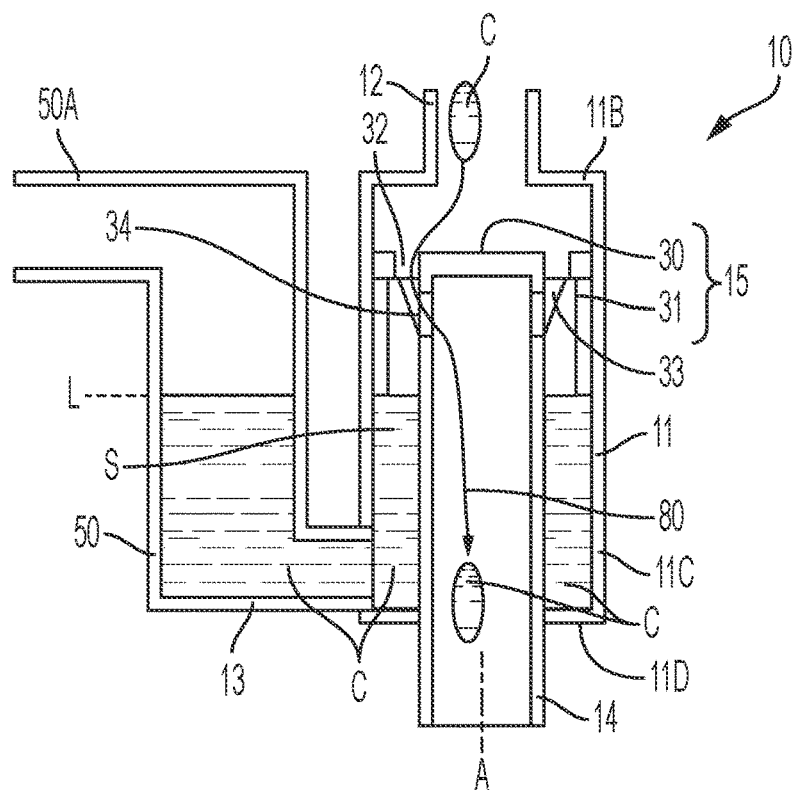
FIG. 5 is a diagram illustrating details of the operation of the refrigerant distribution device which is subsequent to FIG. 4.

As illustrated in FIG. 5, when the amount of refrigerant of the refrigerant liquid C in the heat receiver 50 reaches the reference amount of liquid L, the float valve 31 floats upward and comes in contact with the partition plate 30 located above to switch the flow channel of the refrigerant liquid C.

Specifically, when the float valve 31 rises, the flow channel opening 32 formed in the partition plate 30 communicates with the flow channel opening 33 formed in the float valve 31 and the flow channel opening 34 formed in the upper part of the second refrigerant outflow pipe 14, the passage communicating with the first refrigerant outflow pipe 13 is cut off, and the supply channel of the refrigerant liquid C is switched to the second refrigerant outflow pipe 14 communicating with the other distribution vessels 11 located below.

As a result, the refrigerant liquid C in the heat receiver 50 becomes equal to or less than the reference amount of liquid L and occurrence of a phenomenon in which the refrigerant liquid C does not easily boil due to its weight can be prevented in advance.

Figure 6:
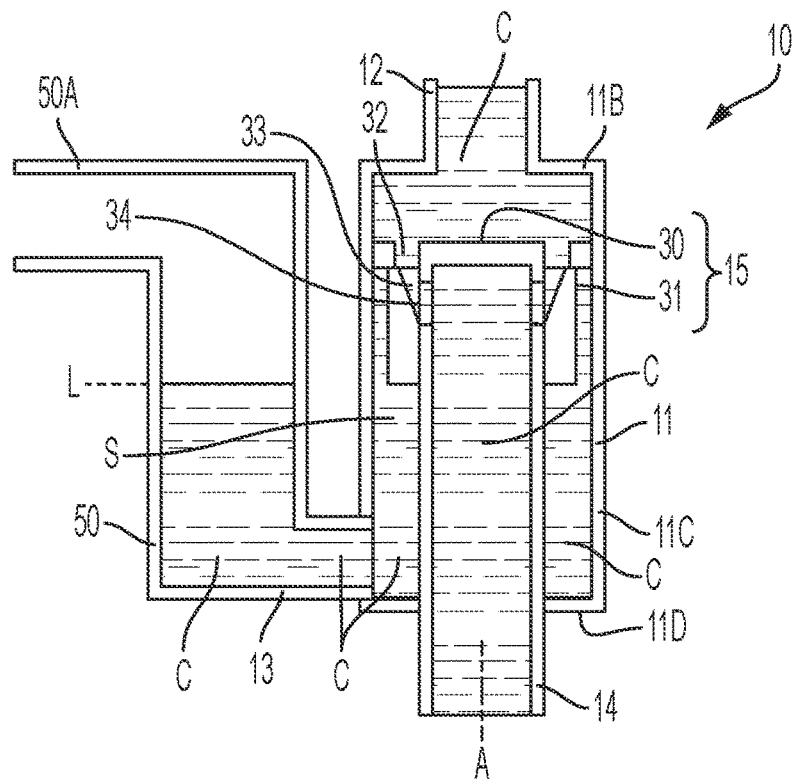
FIG. 6 is a diagram illustrating details of the operation of the refrigerant distribution device which is subsequent to FIG. 5.

As illustrated in FIG. 6, when all the distribution vessels 11 located below are filled with the refrigerant liquid C, the second refrigerant outflow pipe 14 in the uppermost refrigerant distribution device 10 is also filled with the refrigerant liquid C. However, since the passage communicating with the first refrigerant outflow pipe 13 is cut off by the float valve 31 at this time, the refrigerant liquid C in the heat receiver 50 does not exceed the reference amount of liquid L and efficiency of the heat receiver 50 does not decrease.

The heat receivers 50, 51, 52, and 53 are sequentially filled with the refrigerant liquid C supplied via the first refrigerant outflow pipe 13 of the refrigerant distribution device 10 from the uppermost heat receiver (until the reference amount of liquid L is reached), and the heat receiver 53 communicating with the lowermost refrigerant distribution device 10 is finally filled.

In the refrigerant distribution devices 10 which are vertically arranged, the second refrigerant outflow pipes 14 are sequentially filled with the refrigerant liquid C, after the lowermost heat receiver 53 has been filled with the refrigerant liquid C, from the lowermost second refrigerant outflow pipe 14.

The refrigerant distribution devices 10 have the same internal configuration, except that a dummy pipe not having the flow channel opening 34 is used as the second refrigerant outflow pipe 14 in the refrigerant distribution device 10 located at lowest. The dummy pipe only opens and closes a passage communicating with the first refrigerant outflow pipe 13 is performed by the flow channel switching valve 15.

In a cooling system 200 including the refrigerant distribution devices 10 having the above-mentioned configuration, exhaust heat of the servers reaches the heat receivers 50 to 53 via the opening 21 of the main vessel 20 and thus the refrigerant liquid C supplied from the refrigerant distribution devices 10 boils. Accordingly, the exhaust heat of the servers is absorbed, and cooling of the electronic devices is performed.

The refrigerant vapor generated in the heat receivers 50 to 53 is supplied to the heat radiator 60 via the vapor pipes 50A to 53A, the merging pipe 54, and the connection pipe 55 and is condensed (cooled) into a refrigerant liquid C while passing through the heat radiator 60.

Thereafter, the refrigerant liquid C is returned to the refrigerant distribution device 10 via the connection pipe 56. At this time, the refrigerant liquid C is guided into an internal space 11A of a distribution vessel 11 via the refrigerant inflow pipe 12 communicating with the connection pipe 56.

A flow channel switching valve 15 including a partition plate 30 and a float valve 31 is disposed in the internal space 11A of the distribution vessel 11, and the refrigerant liquid C is distributed to the first refrigerant outflow pipe 13 or the second refrigerant outflow pipe 14 via the flow channel switching valve 15.

Specifically, as illustrated in FIGS. 3 and 4, when an amount of refrigerant of the refrigerant liquid C in the heat receiver 50 does not reach the reference amount of liquid L, the float valve 31 is located at a lower position not coming in contact with the partition plate 30, thus the flow channel opening 32 formed in the partition plate 30 communicates with the gap S between the distribution vessel 11 and the second refrigerant outflow pipe 14, and the refrigerant liquid C is supplied to the heat receiver 50 via the first refrigerant outflow pipe 13.

As illustrated in FIG. 5, when the amount of refrigerant of the refrigerant liquid C in the heat receiver 50 reaches the reference amount of liquid L, the float valve 31 floats upward, comes in contact with the partition plate 30 located above, and switches the flow channel of the refrigerant liquid C.

Specifically, the flow channel opening 32 formed in the partition plate 30 communicates with the flow channel opening 33 formed in the float valve 31 and the flow channel opening 34 formed in the upper part of the second refrigerant outflow pipe 14 and cuts off the passage communicating with the first refrigerant outflow pipe 13. Accordingly, the supply channel of the refrigerant liquid C is switched to the second refrigerant outflow pipe 14 communicating with another distribution vessel 11 located below.

As a result, the refrigerant liquid C in the heat receiver 50 falls within the reference amount of liquid L, and occurrence of a phenomenon that the refrigerant liquid C does not boil easily can be prevented in advance. Since the same switching of the refrigerant liquid C is performed on the refrigerant distribution device 10 located below, it is possible to perform flow rate control of the refrigerant liquid C on the heat receivers 51 to 53 such that the amount of refrigerant liquid C does not exceed the reference amount of liquid L in the same way as in the heat receiver 50.

As described above in detail, in the float type flow channel switching valve 15 disposed in the distribution vessel 11 of the refrigerant distribution device 10 according to this embodiment, the passage is switched to the first refrigerant outflow pipe 13 when the amount of refrigerant of the refrigerant liquid C in each of the heat receivers 50 to 53 does not reach the reference amount of liquid L, and the passage communicating with the first refrigerant outflow pipe 13 is cut off and the passage is switched to the second refrigerant outflow pipe 14 when the amount of refrigerant of the refrigerant liquid C in each of the heat receivers 50 to 53 reaches the reference amount of liquid L.

Accordingly, in the refrigerant distribution device 10 according to this embodiment, it is possible to maintain the refrigerant liquid C in the heat receivers 50 to 53 at a fixed value by the operation of the flow channel switching valve 15 disposed in the distribution vessel 11 and to prevent a decrease in heat reception efficiency of the heat receivers 50 to 53.

In the refrigerant distribution device 10 according to this embodiment, since switching of the flow channel switching valve 15 is automatically performed on the basis of the amount of refrigerant liquid C supplied to and stored in the distribution vessel 11, a particular valve driving device is not required and thus the configuration around the valve is prevented from being complicated.

In the embodiment, the flow channel of the refrigerant liquid C is switched by switching the flow channel openings 32 to 34 which are elements of the float type flow channel switching valve 15, but the specific configuration of the flow channel switching valve 15 is not limited to the configuration illustrated in FIGS. 3 to 6 and another installation pattern of the flow channel openings may be employed.

SUPPLEMENTARY NOTE

Supplementary Note 1

A refrigerant distribution device comprising:
a distribution vessel in which a refrigerant liquid flows;
a refrigerant inflow pipe that is connected to a top portion of the distribution vessel and is supplied with a refrigerant liquid;
a first refrigerant outflow pipe that is connected to a bottom portion of the distribution vessel and discharges the refrigerant liquid to one heat receiver;
a second refrigerant outflow pipe that is connected to the bottom portion of the distribution vessel and discharges the refrigerant liquid to the other heat receiver; and
a flow channel switching valve that is disposed in the distribution vessel and operates depending on a level of the refrigerant liquid in the distribution vessel,
wherein the flow channel switching valve switches a passage of the refrigerant liquid to the first refrigerant outflow pipe when an amount of the refrigerant liquid in the one heat receiver does not reach a reference amount of liquid, and cuts off the passage communicating with the first refrigerant outflow pipe and switches the passage to the second refrigerant outflow pipe when the amount of the refrigerant liquid in the one heat receiver reaches the reference amount of liquid.

Supplementary Note 2

The refrigerant distribution device according to Supplementary note 1, wherein the flow channel switching valve is operated by a float that floats in the refrigerant liquid in the distribution vessel.

Supplementary Note 3

The refrigerant distribution device according to Supplementary note 1, wherein the flow channel switching valve includes a partition plate that is disposed in the distribution vessel to vertically partition the inside of the distribution vessel and a float valve that is located below the partition plate and has a buoyant force generated by the refrigerant liquid, and
wherein the float valve comes in contact with the partition plate located above and switches the passage communicating with the first refrigerant outflow pipe to the second refrigerant outflow pipe when the amount of the refrigerant liquid in the one heat receiver reaches the reference amount of liquid.

Supplementary Note 4

The refrigerant distribution device according to Supplementary note 3, wherein the distribution vessel is formed as a cylindrical body centered on an axis along a vertical direction, wherein the second refrigerant outflow pipe is internally fitted to the distribution vessel and is disposed to have a gap portion from an inner wall of the distribution vessel, and wherein the float valve is disposed to be movable in the vertical direction along the axis in the gap portion between the inner wall of the distribution vessel and the second refrigerant outflow pipe.

Supplementary Note 5

The refrigerant distribution device according to Supplementary note 4, wherein the partition plate is disposed to close a top portion of the second refrigerant outflow pipe located in the distribution vessel, and wherein a flow channel opening that switches the passage communication with the first refrigerant outflow pipe to the second refrigerant outflow pipe, when the amount of the refrigerant liquid in the one heat receiver reaches the reference amount of liquid and the float valve comes in contact with the partition plate, is formed in the partition plate and the top portion of the second refrigerant outflow pipe.

Supplementary Note 6

A cooling system in which a plurality of the refrigerant distribution devices according to any one of Supplementary note 1 to 5 are disposed to be connected in series in the vertical direction and the first refrigerant outflow pipes of each of the plurality of refrigerant distribution devices are connected to different heat receivers respectively, wherein the refrigerant inflow pipe of the refrigerant distribution device located below is connected to the second refrigerant outflow pipe of the refrigerant distribution device located above.

Supplementary Note 7

The cooling system according to Supplementary note 6, wherein a plurality of heat receivers connected to the refrigerant outflow pipes of each of the plurality of refrigerant distribution device are connected to a heat radiator that receives a refrigerant which has been evaporated in the heat receivers via a merging pipe, and wherein the heat radiator liquefies the refrigerant by cooling the refrigerant evaporated in the heat receivers and returns the liquefied refrigerant liquid to the refrigerant distribution device located at the uppermost end via the refrigerant inflow pipe.

Supplementary Note 8

A refrigerant distribution method in a refrigerant distribution device including a distribution vessel in which a refrigerant liquid flows, a refrigerant inflow pipe that is connected to a top portion of the distribution vessel and is supplied with a refrigerant liquid, a first refrigerant outflow pipe that is connected to a bottom portion of the distribution vessel and discharges the refrigerant liquid to one heat receiver, a second refrigerant outflow pipe that is connected to the bottom portion of the distribution vessel and discharges the refrigerant liquid to the other heat receiver, and a flow channel switching valve that is disposed in the distribution vessel and switches a passage of the refrigerant liquid to one of the first and second refrigerant outflow pipes, the refrigerant distribution method comprising:

switching the passage by the flow channel switching valve to the first refrigerant outflow pipe when an amount of the refrigerant liquid in the one heat receiver does not reach a reference amount of liquid; and cutting off the passage communicating with the first refrigerant outflow pipe and switching the passage by the flow channel switching valve to the second refrigerant outflow pipe when the amount of the refrigerant liquid in the one heat receiver reaches the reference amount of liquid.

While an embodiment of the invention has been described with reference to the drawings, a specific configuration of the invention is not limited to the embodiment and includes modifications in design or the like not departing from the gist of the invention.

The invention relates to a refrigerant distribution device, a cooling system, and a refrigerant distribution method in a refrigerant distribution device that are used to maintain a processing capability in a data center in which many electronic devices are densely arranged.

What is claimed is:

1. A refrigerant distribution method for a refrigerant distribution device including a distribution vessel in which a refrigerant liquid flows, a refrigerant inflow pipe that is connected to a top portion of the distribution vessel and is configured to be supplied with a refrigerant liquid, a first refrigerant outflow pipe that is connected to a bottom portion of the distribution vessel and is configured to discharge the refrigerant liquid to one heat receiver, a second refrigerant outflow pipe that is connected to the bottom portion of the distribution vessel and is configured to discharge the refrigerant liquid to another heat receiver, and a flow channel switching valve that is disposed in the distribution vessel and is configured to switch a passage of the refrigerant liquid to one of the first and second refrigerant outflow pipes, the refrigerant distribution method comprising:

using the flow channel switching valve to cause the refrigerant liquid to exit the distribution vessel through the first refrigerant outflow pipe if an amount of the refrigerant liquid in the one heat receiver does not reach a reference amount of liquid; and cutting off the passage communicating with the first refrigerant outflow pipe and using the flow channel switching valve to cause the refrigerant liquid to exit the distribution vessel through the second refrigerant outflow pipe if the amount of the refrigerant liquid in the one heat receiver reaches the reference amount of liquid, wherein the flow channel switching valve includes a partition plate that is disposed in the distribution vessel to vertically partition an inside of the distribution vessel and a float that is located below the partition plate and has a buoyant force generated by the refrigerant liquid, and wherein, in the cutting off the passage communicating and the using the flow channel switching valve if the amount of the refrigerant liquid in the one heat receiver reaches the reference amount of liquid, the float contacts the partition plate located above and the passage communicating with the first refrigerant outflow pipe is switched to the second refrigerant outflow pipe.

2. The refrigerant distribution method according to claim 1, wherein the distribution vessel is formed as a cylindrical body centered on an axis along a vertical direction, wherein the second refrigerant outflow pipe is internally fitted to the distribution vessel and is disposed to have a gap portion from an inner wall of the distribution vessel, and wherein the float is disposed in the gap portion between the inner wall of the distribution vessel and the second refrigerant outflow pipe.

3. The refrigerant distribution method according to claim 2, wherein the partition plate is disposed to close a top portion of the second refrigerant outflow pipe located in the distribution vessel, wherein a first flow channel opening is formed in the partition plate, a second flow channel opening is formed in the top portion of the second refrigerant outflow pipe, and a third flow channel opening is formed in the float, and wherein, if the amount of the refrigerant liquid in the one heat receiver reaches the reference amount of liquid and the float comes in contact with the partition plate, then the float cuts off the passage communicating with the first refrigerant outflow pipe, and the first flow channel opening, the second flow channel opening, and the third flow channel opening communicate with the second refrigerant outflow pipe.

4. The refrigerant distribution method according to claim 1, wherein the flow channel switching valve is operated by the float, and the float floats in the refrigerant liquid in the distribution vessel.

* * * * *